United States Patent
Ieong et al.

(10) Patent No.: US 7,525,161 B2
(45) Date of Patent: Apr. 28, 2009

(54) STRAINED MOS DEVICES USING SOURCE/DRAIN EPITAXY

(75) Inventors: Meikei Ieong, Wappingers Falls, NY (US); Xiao Hu Liu, Briarcliff Manor, NY (US); Qiqing Christine Ouyang, Yorktown Heights, NY (US); Siddhartha Panda, Kanpur (IN); Haizhou Yin, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/669,902

(22) Filed: Jan. 31, 2007

(65) Prior Publication Data

US 2008/0179627 A1    Jul. 31, 2008

(51) Int. Cl.
*H01L 29/94* (2006.01)
(52) U.S. Cl. ............... 257/369; 257/E27.064; 257/19
(58) Field of Classification Search ............... 257/369
See application file for complete search history.

(56) References Cited

U.S. PATENT DOCUMENTS

| | | | |
|---|---|---|---|
| 5,534,713 A | 7/1996 | Ismail | 257/24 |
| 5,847,419 A | 12/1998 | Imai | 257/192 |
| 6,319,799 B1 | 11/2001 | Ouyang | 438/528 |
| 6,600,170 B1 | 7/2003 | Xiang | 257/18 |
| 6,881,635 B1 | 4/2005 | Chidambarrao | 438/300 |
| 6,927,414 B2 | 8/2005 | Ouyang | 257/200 |
| 6,955,952 B2 | 10/2005 | Yeo | 438/154 |
| 6,963,078 B2 | 11/2005 | Chu | 257/19 |
| 7,057,216 B2 | 6/2006 | Ouyang | 257/194 |
| 2005/0151134 A1 | 7/2005 | Hsu | 257/66 |
| 2005/0285187 A1* | 12/2005 | Bryant et al. | 257/335 |
| 2006/0081875 A1* | 4/2006 | Lin et al. | 257/190 |
| 2006/0145264 A1* | 7/2006 | Chidambarrao et al. | 257/369 |
| 2006/0292779 A1* | 12/2006 | Chen et al. | 438/197 |
| 2007/0105331 A1* | 5/2007 | Murthy et al. | 438/341 |
| 2007/0196987 A1* | 8/2007 | Chidambarrao et al. | 438/285 |
| 2007/0210314 A1* | 9/2007 | Winstead et al. | 257/69 |
| 2007/0254423 A1* | 11/2007 | Chidambarrao et al. | 438/197 |
| 2007/0257249 A1* | 11/2007 | Mocuta et al. | 257/19 |

OTHER PUBLICATIONS

"New Stress Inducing Technique of Epitaxial Si on Recessed S/D Fabricated in Substrate Strained-Si of <100>-Channel on Rotated Wafers" IEDM Technical Digest, pp. 501-504, 2005.

\* cited by examiner

*Primary Examiner*—Jerome Jackson, Jr.
*Assistant Examiner*—Paul A Budd
(74) *Attorney, Agent, or Firm*—George Sai-Halasz (57) ABSTRACT

NMOS and PMOS device structures with separately strained channel regions and methods of their fabrication are disclosed. The source and the drain of the NMOS device is epitaxially grown of a material which causes a shift in the strain of the NMOS device channel in the tensile direction. While, the source and the drain of the PMOS device is epitaxially grown of a material which causes a shift in the strain of the PMOS device channel in the compressive direction.

9 Claims, 6 Drawing Sheets

STRAINED MOS DEVICES USING SOURCE/DRAIN EPITAXY

FIELD OF THE INVENTION

The present invention relates to electronic devices. In particular, it relates to MOS devices which are under tensile or compressive strain, and to methods for producing such structures by epitaxially growing source and drain junctions.

BACKGROUND OF THE INVENTION

Today's integrated circuits include a vast number of devices. Smaller devices and shrinking ground rules are the key to enhance performance and to reduce cost. As FET (Field- Effect- Transistor) devices are being scaled down, the technology becomes more complex, and changes in device structures and new fabrication methods are needed to maintain the expected performance enhancement from one generation of devices to the next. The mainstay material of microelectronics is silicon (Si), or more broadly, Si based materials. One such Si based material of importance for microelectronics is the silicon-germanium (SiGe) alloy.

There is a great difficulty in maintaining performance improvements in devices of deeply submicron generations. Therefore, methods for improving performance without scaling have become of interest. One general approach for improving performance is to increase carrier (electron and/or hole) mobilities in FETs. A promising avenue toward better carrier mobility is to modify the semiconductor that serves as raw material for device fabrication. It has been known, and recently further studied, that tensilely or compressively strained semiconductors have intriguing carrier properties. In particular, improvement in the electron mobility has been achieved in a strained silicon (Si) channel NMOS as described in U.S. Pat. No. 6,649,492 B2 to J. O. Chu entitled "Strained Si Based Layer Made By UHV-CVD, and Devices Therein" incorporated herein by reference. Similarly for hole enhancement, compressively-strained SiGe have yielded high hole mobilities. Germanium (Ge) also has attractive hole carrier properties. It is for this reason that the SiGe alloy is an advantageous material for hole conduction type devices. The band structures of Si and Ge, and of the SiGe alloy, as well, are such that the hole transport, primarily hole mobility, improves if the materials are under compressive strain. Combination of tensilely and compressively strained SiGe regions in the same wafer is described in U.S. Pat. No. 6,963,078 to J. O. Chu "Dual Strain-State SiGe Layers for Microelectronics", incorporated herein by reference.

Strained-Si layers may be the results of biaxial tensile strain induced in silicon grown on a substrate, which substrate is formed of a material whose lattice constant is greater than that of silicon. The lattice constant of germanium is about 4.2% greater than that of silicon, and the lattice constant of a silicon-germanium alloy is roughly a linear function of its germanium concentration. As a result, the lattice constant of a SiGe alloy containing fifty atomic percent germanium is about 2% greater than the lattice constant of silicon. Epitaxial growth of silicon on such a SiGe substrate will yield a silicon layer under tensile strain. In general, if the epitaxial layer has a smaller Ge concentration than the underlying layer and its thickness is less than the critical thickness, the epitaxial layer is under tensile strain, and conversely, if the underlying layer has a lower Ge concentration, the epitaxial layer is under compressive strain.

Ideally, one would like to have integrated circuits such that the electron conduction type devices, such as NMOS, are hosted in a tensilely strained Si or SiGe material, while the hole conduction type devices, such as PMOS, are hosted in a compressively strained Ge or SiGe material. (MOSFET stands for Metal Oxide Semiconductor Field- Effect- Transistor, a name with historic connotations meaning in general an insulated gate Field- Effect- Transistor, while nFET or NMOS and pFET or PMOS stand for n and p type MOS-FETs.)

SUMMARY OF THE INVENTION

In view of the discussed problems, embodiments of the present invention disclose NMOS and PMOS device structures of strained materials. The NMOS and the PMOS are having their corresponding channel regions hosted in a Si based layer. The Si based layer is epitaxially disposed over a SiGe support layer, and the Si based layer has a thickness which is less than the critical thickness. A first state of strain is pertaining to the Si based layer based on its epitaxial relation to the SiGe support layer.

The device structure further includes a second Si based material epitaxially interfacing with the Si based layer and with the SiGe support layer. The source and the drain of the NMOS device are composed of the second Si based material, which has lower Ge concentration than the SiGe support layer. This second Si based material fills a first void which was created for the source and the drain of the NMOS device. The first void penetrated through the Si based layer and into the SiGe support layer. The second Si based material causes the channel region of the NMOS device to be in such a strain state which is shifted in the tensile direction compared to the first state of strain.

The device structure further includes a second SiGe material epitaxially interfacing with the Si based layer and with the SiGe support layer. The source and the drain of the PMOS device are composed of the second SiGe material, which has higher Ge concentration than the SiGe support layer. This second SiGe material fills a second void which was created for the source and the drain of the PMOS device. The second void penetrated through the Si based layer and into the SiGe support layer. The second SiGe material causes the channel region of the PMOS device to be in such a strain state which is shifted in the compressive direction compared to the first state of strain.

Embodiments of the present invention further disclose methods for fabricating the device structure.

BRIEF DESCRIPTION OF THE DRAWINGS

These and other features of the present invention will become apparent from the accompanying detailed description and drawings, wherein.

DETAILED DESCRIPTION OF THE INVENTION

Embodiments of the present invention combine the enhanced electron mobility of NMOS devices having tensilely strained channels and the enhanced hole mobility of PMOS devices having compressively strained channels. In representative embodiments of the present invention the sources and drains of the NMOS and PMOS devices are epitaxially grown with such material compositions that they shift the state of strain of the NMOS devices toward the tensile direction, and the state of strain of PMOS devices toward the compressive direction. These shifts in the strain are in relation to that state of strain which would be present in the channels of these devices without the epitaxial sources and drains.

Figure 1A:
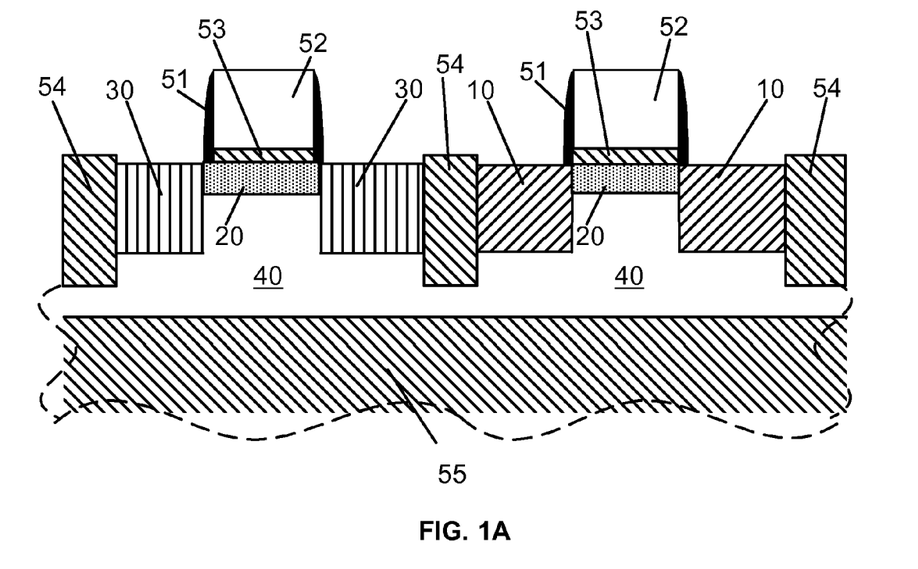
FIGS. 1A and 1B show in a schematic cross sectional view variations of embodiments of strained devices with epitaxial sources and drains.
Figure 1B:
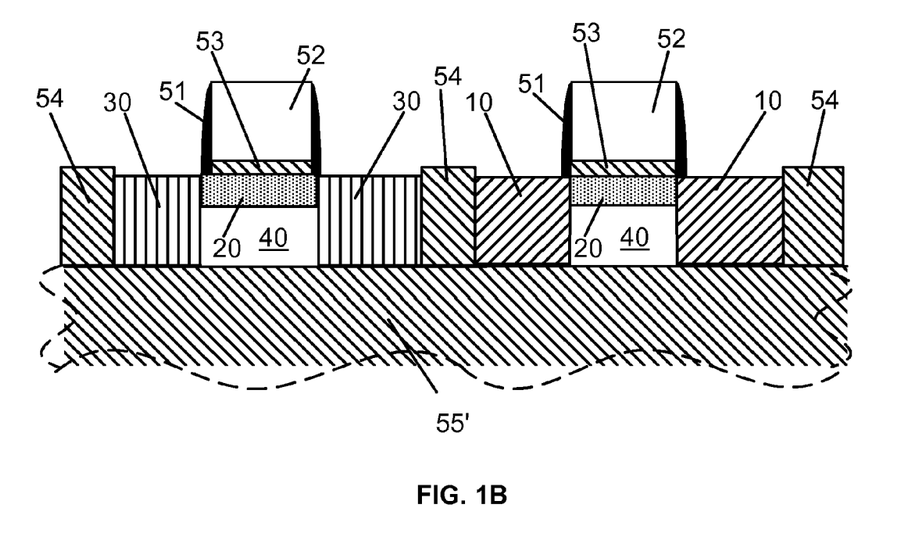

FIGS. 1A and 1B show in a schematic cross sectional view variations of embodiments for a strained device structure with epitaxial sources and drains. The device structure has both NMOS and PMOS devices. In representative embodiments of the present invention the NMOS and PMOS devices would be connected into CMOS circuit configurations, as known in the art. However, the epitaxial source/drain may find use in other kind of microelectronics applications, for instance in analog circuits, memories, and more.

Part of the processing of the device structure may proceed in a manner know in the art, since NMOS and PMOS devices are well established in the electronic arts. In FIGS. 1A and 1B the devices are schematically displayed in such a way that only those components are shown which are of interest for presenting representative embodiments of the present invention. Similar elements, for instance gates 52, are indicated with the same indicator numbers on the PMOS and NMOS devices, although one skilled in that would know that similar elements in NMOS and PMOS may often differ in their details. However, such details may not be of significance for a representative embodiment of the present invention.

The device structure is supported by a substrate 55 in manners known in the art. Such a substrate may be a buried oxide layer (BOX) in case of SOI technology, or a Si substrate in case of bulk technology, or any other known type of substrate. In a typical embodiment of the present invention the substrate may also include a SiGe layer with graded Ge concentration. As it is further known in the art, the devices have gates 52, gate insulators 53, and typically spacers 51. The devices are isolated from each other by isolation structures 54, such as, for instance, shallow trench isolation.

The NMOS and PMOS devices contain a relaxed single-crystal SiGe support layer 40 over the substrate 55. The lattice constant of this SiGe support layer 40, at its interface with the single crystal Si based layer 20, is one of the components in determining the level of strain that can be found in the channel regions of the devices.

As it is well known in the art, strain arises in the Si based layer 20 when the Ge content of this layer differs from the Ge content of the SiGe support layer 40. The two layers are both single crystals, and in epitaxial relation with each other, as the Si based layer 20 is epitaxially disposed over the SiGe support layer 40. In representative embodiments of the present invention the thickness of the Si based layer 20 is below a critical thickness. The critical thickness for a layer is a well defined parameter, being that thickness over which the layer begins to relax back toward its equilibrium lattice spacing, and structural defects are formed. The critical thickness depends on the lattice constant difference between the two epitaxial layers. The larger the difference, the smaller the critical thickness becomes. In a typical embodiment the thickness of the Si based layer 20 may be between about 10 nm and about 70 nm. Since the thickness of the Si based layer 20 is less than the critical thickness, its equilibrium state of strain is determined by the lattice constant difference between it, and that of the SiGe support layer 40. This equilibrium state of strain is referred to as the first state of strain, and it pertains to the Si based layer 20 because of its epitaxial relation to the SiGe support layer 40.

The thickness of the SiGe support layer 40 may vary widely, from about 50 nm to a few micrometers, depending on several factors, such as its Ge concentration, and the nature of the substrate 55.

The Si based layer 20 is the one hosting the devices. The term of hosting a device in a certain material, or layer, means that the critical part of the device, which is mainly sensitive to carrier properties, such as, for instance, the channel of MOSFET devices, is residing in, composed of, housed in, that certain material, or layer.

In representative embodiments of the present invention the Ge content, if any, of the Si based layer 20 is less than about 20% Ge, and it is usually below the Ge content of the SiGe support layer 40. In a representative embodiment of the present invention the Si based layer 20 is essentially Si. As a consequence of the relative Ge contents of the Si based layer 20 and the SiGe support layer 40, the first state of strain in the Si based layer is typically a tensile one. As known in the art, tensile strain may be advantageous for NMOS devices, but less so for PMOS devices. Accordingly, one would prefer to distinguish between the NMOS and the PMOS, and create additional strain in the channel regions of the devices in a manner that this additional strain is shifting the first state of strain toward the tensile direction in the NMOS, typically making it more tensile, while shifting the first state of strain toward the compressive direction in the PMOS, typically making it less tensile, or even switching over to a compressive state of strain.

The differentiation in the strain states of the NMOS and PMOS channel regions may be accomplished by embedding for each device its own source and drain, which are composed of appropriately selected materials.

For the NMOS device the source and the drain are formed by embedding a second Si based material 30 into the Si based layer 20 and the SiGe support layer 40. This second Si based material 30 is in epitaxial relation, and it is interfacing with the Si based layer 20 and with the SiGe support layer 40. If the second Si based material 30 contains Ge, it has a lower Ge concentration than the SiGe support layer 40. The Ge concentration of the second Si based material 30 is typically below about 20%. In an exemplary embodiment of the present invention the second Si based material is essentially Si.

The second Si based material 30 is substantially filling in voids, referred to as first voids 31 (FIG. 3), which were created specifically for the source and the drain of the NMOS device. In exemplary embodiments of the present invention the second Si based material 30 is completely filling in the first voids 31. The original material at the source and drain location was removed to such a degree that the first void 31 penetrated through the Si based layer 20 and into the SiGe support layer 40. The second Si based material 30 was epitaxially deposited into this void, thereby creating the new single crystal material source/drain.

When the second Si based material 30 is formed in the voids in the SiGe support layer 40, the atoms of the second Si based material 30 stretch to align themselves to the larger lattice structure of the SiGe support layer 40, resulting in tensile strain for the SiGe support layer 40 in the source/drain regions. This tensile strain, in turn, transfers, and stretches the channel region. As far as the NMOS device channel is concerned, this tensile strain inside the SiGe support layer 40, resulting from the embedded second Si based material 30, combines with the originally present first state of strain, with the net result that it shifts the first state of strain toward the tensile direction. For the NMOS device's electrical properties, chiefly the electron mobility, the shift toward a more tensile state is the sought after result: causing an increase of the electron mobility.

For the PMOS device the source and the drain are formed by embedding a second SiGe material 10 into the Si based layer 20 and the SiGe support layer 40. This second SiGe material 10 is in epitaxial relation and interfacing with the Si based layer 20 and with the SiGe support layer 40. The second SiGe material 10 typically has a higher Ge concentration than the SiGe support layer 40.

The second SiGe material 10 is substantially filling in voids, referred to as second voids 11 (FIG. 5), which were created specifically for the source and the drain of the PMOS device. In exemplary embodiments of the present invention the second Si based material 30 is completely filling in the second voids 11. The original material at the source and location was removed to such a degree that the second void penetrated through the Si based layer 20 and into the SiGe support layer 40. The second SiGe material 10 was epitaxially deposited into this void, thereby creating the new single crystal material source/drain.

When the second SiGe material 10 is formed in the void in the SiGe support layer 40, the atoms of the second SiGe material 10 are compressed to align themselves to the smaller lattice structure of the SiGe support layer 40, resulting in compressive strain in the source/drain regions. This compressive strain, in turn, transfers, and compresses the channel region. As far as the PMOS device channel is concerned, this compressive strain, resulting from the embedded second SiGe material 10, combines with the originally present first state of strain, with the net result that it shifts the first state of strain toward the compressive direction. For the PMOS device's electrical properties, chiefly the hole mobility, the shift toward a more compressive state is the sought after result: causing an increase of the hole mobility.

Detailed simulations show that the strain shifts achievable with embedding an epitaxial source and drain can be quite significant. In a representative embodiment of the present invention the Ge concentration of the SiGe support layer 40 may be 20%, and the Si based layer 20 may be essentially Si. Detailed numerical simulations show that imbedding in the NMOS source/drain a second Si based material 30, which is also essentially Si, the tensile strain in the channel directly under the gate insulator shifts toward a more highly tensile state, increasing the tensile strain by about 30%. If one includes the strain at the edge of the channel, in the so called spacer region, as well, the shift is over 50%. For the PMOS device, with the same Si based layer 20 of essentially Si, and the same SiGe support layer 40 with 20% Ge, and embedding in the source/drain a second SiGe material 10 with 40% Ge, the detailed simulations show that the tensile strain directly under the gate insulator decreased by approximately 20%. If one includes the strain at the edge of the PMOS channel, in the so called spacer region, as well, the shift is over 30%. The higher Ge concentration of the second SiGe material 10 shifts the original first strain state of the channel under the gate insulator in the compressive direction.

In general, shifts in the state of strain reflect changes in the lattice constant of the material which is being strained. One can characterize a shift in the state of strain with a corresponding change in the lattice constant of the material under the strain. The various SiGe alloys all have lattice constants between that of relaxed Si, 0.5431 nm, and that of relaxed Ge, 0.5646 nm. Accordingly, it is natural to characterize a change in the state of strain with a change in the lattice constant expressed as a fraction of the difference between the relaxed Ge lattice constants and the relaxed Si lattice constants. In representative embodiments of the present invention the expected shifts in the state of strain following the embedding of the source/junctions with the appropriately chosen Ge concentrations, in absolute terms, correspond to lattice constant changes which are at least 3% of the difference between the relaxed Ge and the relaxed Si lattice constants. However, one may significantly exceed this value in some exemplary embodiment of the present invention.

Depending on the needs of particular embodiments, the composition of the SiGe support layer 40 may vary in a broad range, basically from about 15% to about 85% of Ge concentration. It is also possible that the Si based layer 20 happens to have the same composition as the SiGe support layer 40. In such a case, clearly, there is no obvious boundary between the SiGe support layer 40 and the Si based layer 20. Such may be the case in some embodiments of the present invention. For instance, in a test case, where the SiGe support layer 40 and the Si based layer 20 are both essentially relaxed Si, detailed simulation show that embedding a second SiGe material 10 source/drain with 20% Ge content causes a compressive strain which under the gate corresponds to 5%, and in average over the whole of the channel corresponds to 7%, of lattice constant change as a percentage of the Si/Ge lattice constant difference.

The figures presenting embodiments of the invention are obviously schematic, and as one skilled in the art would notice there may be many variations in the details. For instance, in the figures the second Si based material 30 and second SiGe material 10 and their respective voids 31 and 11 are abutting the isolation structures 54. The detail in the figures, for instance, such as this abutting, should not be interpreted restrictively. In an exemplary embodiment of the present invention there may very well be material, such as the Si based layer 20 and the SiGe support layer 40, between the isolation structures 54 and the sources and drains of the devices.

FIG. 1B shows a variation of the embodiment of FIG. 1A. In this particular embodiment of interest, the substrate is BOX indicated as 55', as one of the generally available possibilities. In this embodiment the whole device structure is quite shallow. The embedded source/drains of the second Si based material 30 and the second SiGe material 10 reach all the way down to the BOX substrate. In this embodiment a lateral growth of the embedded epitaxial sources and drains may be significant.

Having presented representative embodiments of the device structures of the present invention, further figures depict stages in the processing. Only those steps are discussed which have relevance regarding the embodiments of the invention. The full processing of such device structures, as one skilled in the art would recognize, involves hundreds of steps known in the art.

Figure 2:
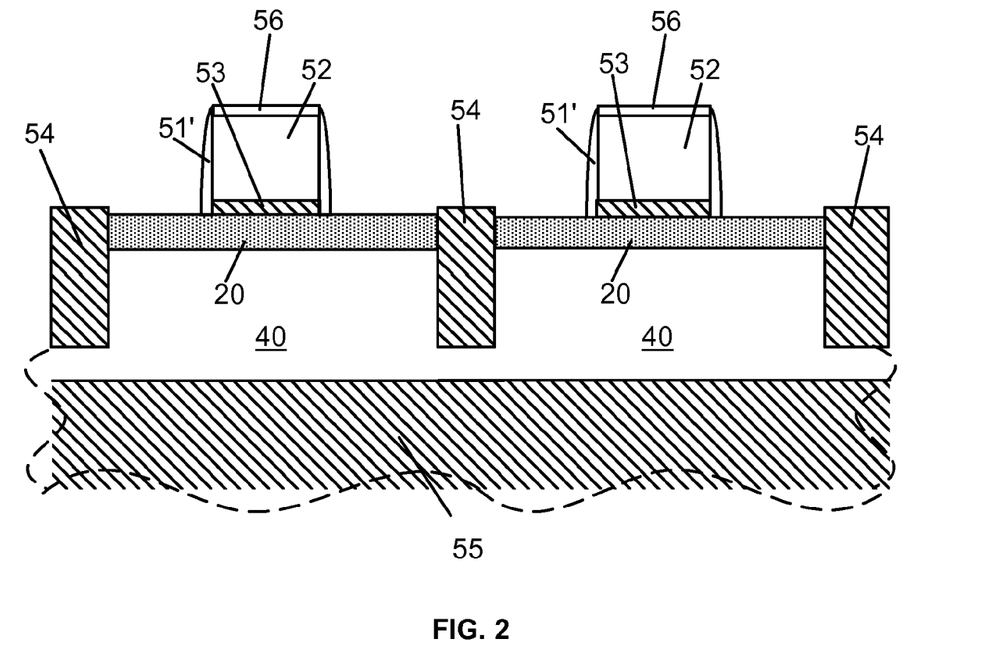
FIG. 2 shows a schematic cross section of a stage in the processing where the devices are ready for source/drain fabrication.

FIG. 2 shows a schematic cross section of a stage in processing where the devices are ready for source/drain fabrication. Fabrication steps up to this point followed avenues well known in the art. The spacers in FIG. 2 are marked as 51', instead of 51 as in FIG. 1, to indicate that they might not be the same spacers. During fabrication of device structures, spacers may often be built and removed. An insulating layer 56 is shown to indicate that the gates may be in need of extra protection during processing. Again, such elements and their fabrication are known to those skilled in the art. The SiGe support layer 40 and the Si based layer 20 are already in place. Depending on the relative Ge content of the these two layers, the strain in the Si based layer 20 may be practically any kind. The strain state in the Si based layer 20 at this stage, before the embedding of the sources and the drains, is the first state of strain.

Figure 3:
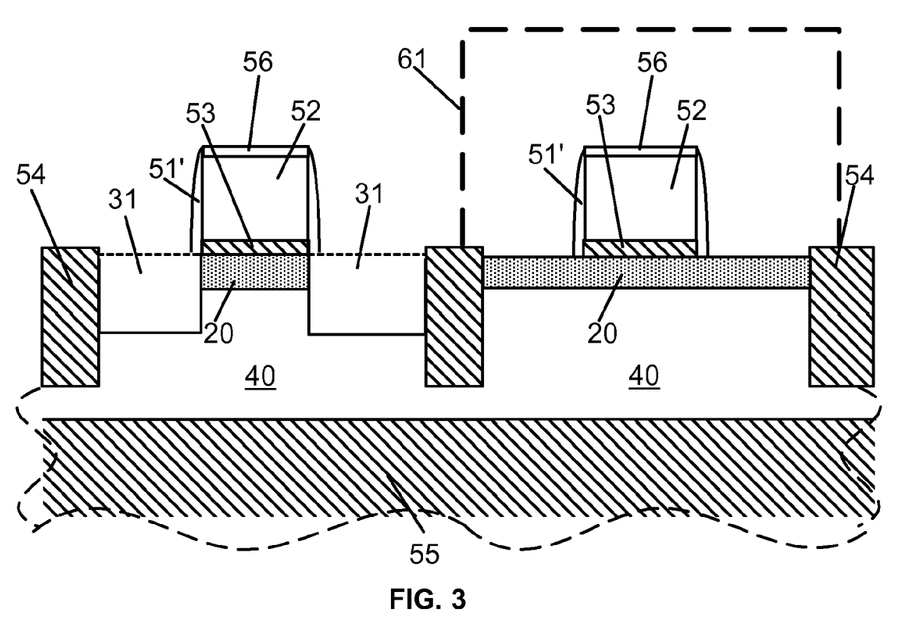
FIG. 3 shows a schematic cross section of a stage in the processing where in one device voids have been created in the source/drain regions.

FIG. 3 shows a schematic cross section of a stage in processing where for one of the devices voids have been created in the source/drain regions. In general, the order in the processing of the NMOS and PMOS devices is of no major consequence. For illustration, herein it is assumed that the NMOS device is the one first processed. In FIG. 3 the first voids 31, one for the source one for the drain, have already been created, and the dashed line over the first voids 31 guides the eye as to where the surface was originally.

The first voids 31 are formed by etching the Si based layer 20 and the SiGe support layer 40 in the source/drain regions. The depth of the first voids 31 may be between about 30 nm and about 100 nm, penetrating through the Si based layer 20. The first voids 31 are typically formed by reactive ion etching (RIE). The RIE etch may be isotropic or anisotropic. In embodiments where there is a need to approach the channel closely, isotropic RIE is preferred, which may give a lateral undercut underneath the spacers 51'. To leave other structures, such as the gate 52, intact, the RIE is preferred to be selective, as it is known in the art. While the processing is proceeding on one type of devices, in this case the NMOS, the other type, in this case the PMOS, is protected 61 by methods known in the art.

Figure 4:
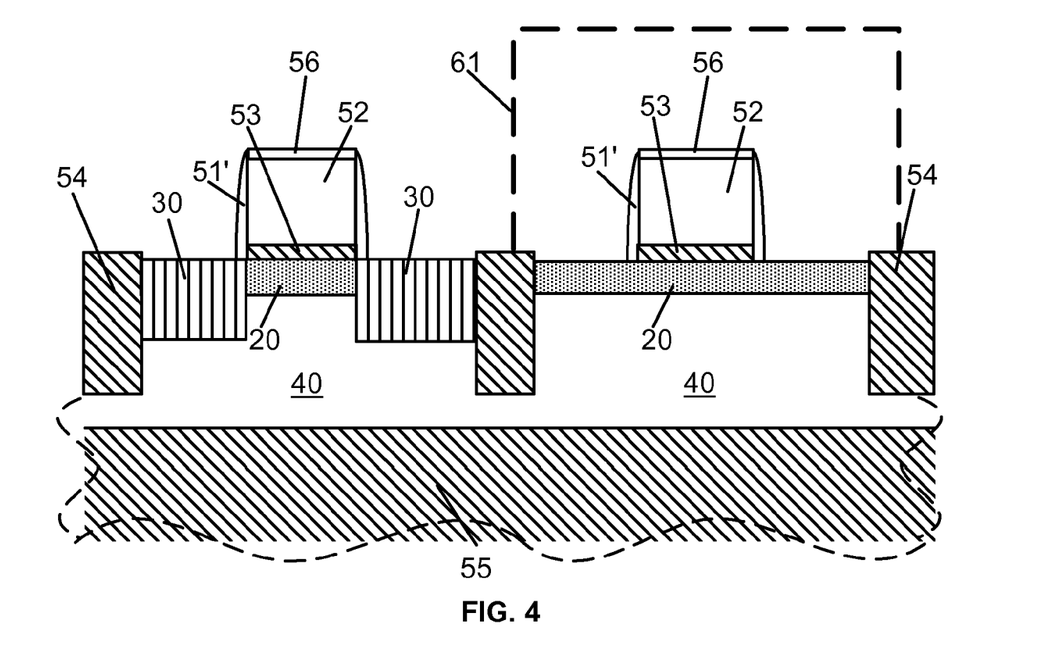
FIG. 4 shows a schematic cross section of a stage in the processing where in one device an epitaxial source/drain has been fabricated.

FIG. 4 shows a schematic cross section of a stage in processing where for one device the epitaxial source/drain has already been fabricated. The second Si based material 30 is deposited into the first voids 31 by selective epitaxy. The terms "epitaxially", "epitaxy", "epi" etc. carry their customary usage: an epitaxial method is used to deposit a layer, while structurally the meaning is that the single crystal lattice structure carries across the interfaces. If the second Si based material 30 contains Ge, it has a lower Ge concentration than the SiGe support layer 40. The second Si based material 30 typically has below about 20% of Ge concentration. In a representative embodiment of the present invention the second Si based material 30 may be essentially Si. Techniques for selective deposition are known in the art, one such technique that may be employed is ultra-high vacuum chemical vapor depositions (UHV-CVD). The temperature range for depositing the second Si based material 30 may be between about 620° C. and about 800° C.

Figure 5:
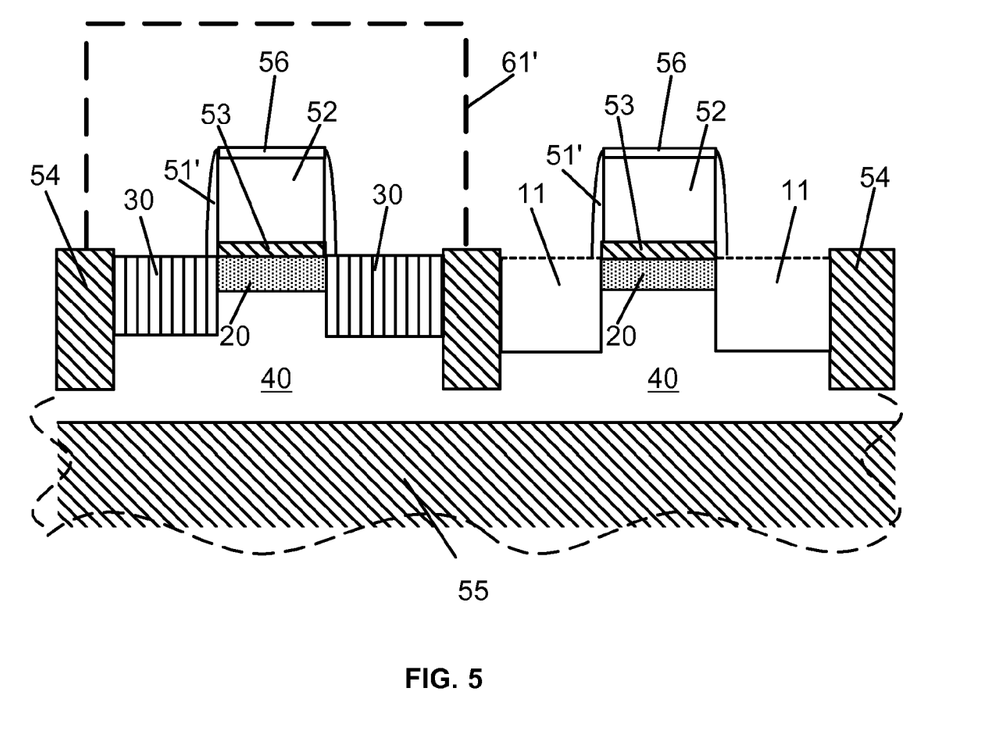
FIG. 5 shows a schematic cross section of a stage in the processing where in the complementary device voids have been created in the source/drain region.

FIG. 5 shows a schematic cross section of a stage in processing where in the complementary device voids have been created in the source/drain regions. The second voids 11 are formed by etching the Si based layer 20 and the SiGe support layer 40 in the source/drain regions. The dashed line over the second voids 11 is only for guiding the eye as to where the surface was originally. The depth of the second voids 11 may be between about 30 nm and about 100 nm, penetrating through the Si based layer 20. The depth of the first 31 and second 11 voids, and consequently the source/drain depths of the NMOS and PMOS devices do not have to be the same in representative embodiments of the present invention. The depth parameters of the voids can be individually chosen depending on particular needs. The second voids 11 are typically formed by reactive ion etching (RIE). The RIE etch may be isotropic or anisotropic. In embodiments where there is a need to approach the channel closely, isotropic RIE is preferred, which may give a lateral undercut underneath the spacers 51'. To leave other structures, such as the gate 52, intact, the RIE is preferred to be selective, as it is known in the art. While the processing is proceeding on one type of devices, in this case the PMOS, the other type, in case the NMOS, is protected 61' by methods known in the art.

Figure 6:
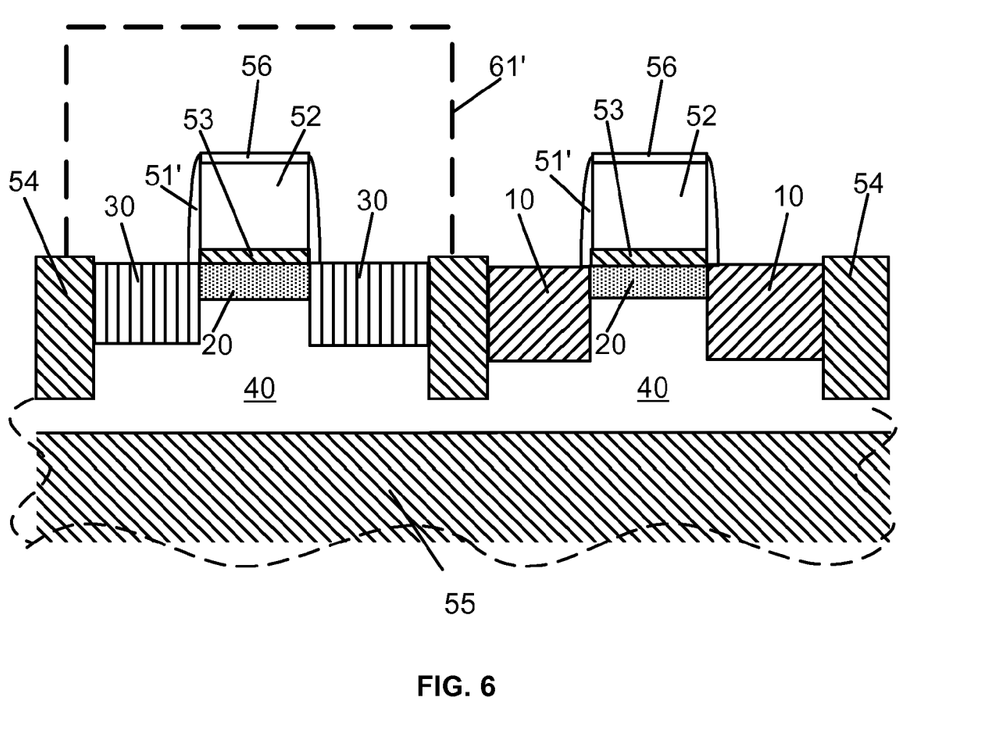
FIG. 6 shows a schematic cross section of a stage in the processing where in the complementary device an epitaxial source/drain has been fabricated.

FIG. 6 shows a schematic cross section of a stage in processing where in a complementary device structure epitaxial source/drains have been fabricated. The second SiGe material 10 is deposited into the second voids 11 by selective epitaxy. The single crystal second SiGe material 10 contains higher Ge concentration than the SiGe support layer 40. The second SiGe material 10 has typically above 20% of GE concentration. In a representative embodiment of the present invention the second SiGe material 10 may be essentially Ge. Techniques for selective deposition are known in art, one such technique that may be employed is UHV-CVD. The temperature range for depositing the second SiGe material 10 may be between about 550° C. and about 750° C.

Following the epitaxial growth of the source/drain junctions the fabrication process may continue along paths known in the art. Furthermore, in representative embodiments of the present invention one may connect, couple NMOS and PMOS devices into CMOS circuits, as known in the art.

Many modifications and variations of the present invention are possible in light of the above teachings, and could be apparent for those skilled in the art. The scope of the invention is defined by the appended claims.

We claim:

1. A device structure, comprising:
at least one NMOS device and at least one PMOS device, wherein said NMOS device and said PMOS device are having their corresponding channel regions hosted in NMOS and PMOS portions of a Si based layer, wherein said Si based layer is epitaxially disposed over a SiGe support layer, thereby having an interface with said SiGe support layer;
a second Si based material epitaxially interfacing with said NMOS portion of said Si based layer on each side of said NMOS channel region, wherein a source and a drain of said NMOS device comprise at least a portion of said second Si based material, wherein said interfacing of said second Si based material with said Si based layer is substantially perpendicular to said interface of said Si based layer and said SiGe support layer, wherein said second Si based material penetrates through said Si based layer and is epitaxially interfacing with said SiGe support layer, wherein said second Si based material has lower Ge concentration than said SiGe support layer;
a second SiGe material epitaxially interfacing with said PMOS portion of said Si based layer on each side of said PMOS channel region, wherein a source and a drain of said PMOS device comprise at least a portion of said second SiGe material, wherein said interfacing of said second SiGe material with said Si based layer is substantially perpendicular to said interface of said Si based layer and SiGe support layer, wherein said second SiGe material penetrates through said Si based layer and is epitaxially interfacing with said SiGe support layer, wherein said second SiGe material has higher Ge concentration than said SiGe support layer; and
wherein said Si based layer is SiGe with a Ge concentration of less than about 20%.

2. The device structure of claim 1, wherein said second Si based material is SiGe with a Ge concentration of less than about 20%.

3. The device structure of claim 1, wherein said second Si based material is essentially Si.

4. The device structure of claim 1, wherein said thickness of said Si based layer is between about 10 nm and about 70 nm.

5. The device structure of claim 1, wherein said second Si based material and said second SiGe material each has a penetration depth, wherein said penetration depths are between about 30 nm and about 100 nm.

6. The device structure of claim 1, wherein said second Si based material is inducing a dilation of the lattice constant of said NMOS portion of said Si based layer, wherein said dilation is at least a 3% of the difference between the relaxed Ge lattice constant and the relaxed Si lattice constant.

7. The device structure of claim 1, wherein said second SiGe material is inducing a compression of the lattice constant of said PMOS portion of said Si based layer, wherein said compression is at least a 3% of the difference between the relaxed Si lattice constant and the relaxed Ge lattice constant.

8. The device structure of claim 1, wherein said device structure is connected into a CMOS circuit.

9. The device structure of claim 1,
wherein said SiGe support layer is disposed over a buried oxide layer(BOX), and
wherein said Si based material penetrates through said Si based layer and said SiGe support layer and is contacting said BOX.

* * * * *